US006204601B1

(12) United States Patent
Lidström et al.

(10) Patent No.: US 6,204,601 B1
(45) Date of Patent: Mar. 20, 2001

(54) DEVICE FOR CONTROLLING A MAGNETRON FILAMENT CURRENT BASED ON DETECTED DYNAMIC IMPEDANCE

(75) Inventors: Kjell Lidström, Bureå; Jan Grabs, Bålsta, both of (SE)

(73) Assignee: Fusion Lighting, Inc., Rockville, MD (US)

( * ) Notice: Subject to any disclaimer, the term of this patent is extended or adjusted under 35 U.S.C. 154(b) by 0 days.

(21) Appl. No.: 09/254,224

(22) PCT Filed: Sep. 9, 1997

(86) PCT No.: PCT/SE97/01519

§ 371 Date: Apr. 12, 1999

§ 102(e) Date: Apr. 12, 1999

(87) PCT Pub. No.: WO98/11591

PCT Pub. Date: Mar. 19, 1998

(30) Foreign Application Priority Data

Sep. 10, 1996 (SE) .................................................. 9603291

(51) Int. Cl.[7] .............................. H03B 9/10; H01J 25/50

(52) U.S. Cl. .......................... 315/39.51; 315/94; 315/105

(58) Field of Search ............................. 315/39.51, 39.63, 315/94, 105

(56) References Cited

U.S. PATENT DOCUMENTS 2,940,010 * 6/1960 Kenny ............................. 315/105 X
4,992,637 2/1991 Ishiyama ............................ 363/21 X
5,721,470 * 2/1998 Kuriyama et al. ..................... 315/94

FOREIGN PATENT DOCUMENTS

4238199 A1 5/1994 (DE) .
04449275A2 10/1991 (EP) .
5-67493 3/1993 (JP) .

* cited by examiner

*Primary Examiner*—Justin P. Bettendorf
(74) *Attorney, Agent, or Firm*—Burns, Doane, Swecker & Mathis LLP

(57) ABSTRACT

The present invention refers to a method for controlling a magnetron filament current. The control is provided by detecting the dynamic impedance or a noise level of the magnetron and by controlling the magnetron filament current based thereupon.

29 Claims, 4 Drawing Sheets

FIG. 3a
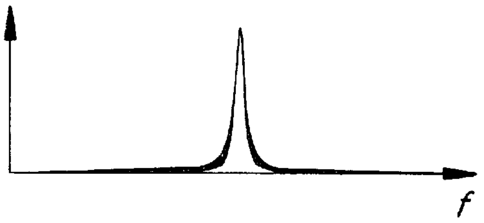
FIG. 3b
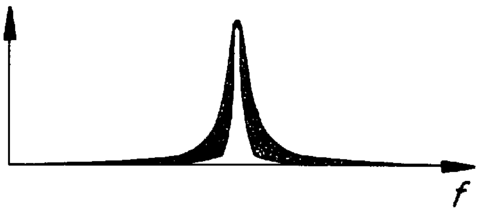
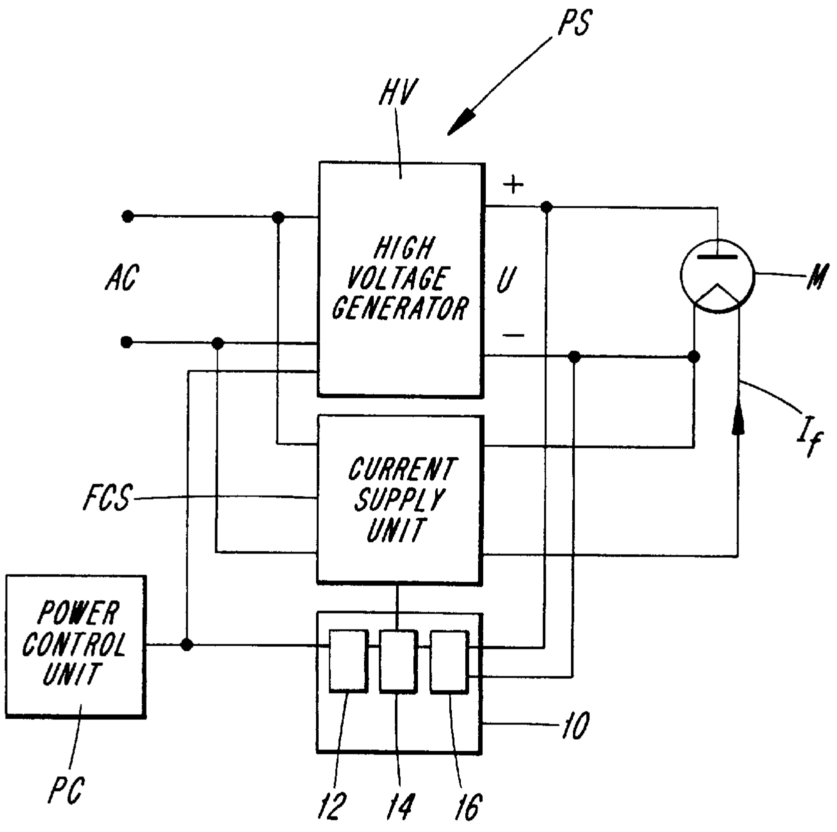
FIG. 4

DEVICE FOR CONTROLLING A MAGNETRON FILAMENT CURRENT BASED ON DETECTED DYNAMIC IMPEDANCE

TECHNICAL FIELD OF INVENTION

The present invention refers to a method and a device for controlling the filament current of a magnetron.

TECHNICAL BACKGROUND AND PRIOR ART

Magnetrons are used within the field of microwave technology for converting electrical energy into microwaves. For example, magnetrons are used as microwave sources in radar equipment, microwave ovens, and plasma lamps.

The power supply to a magnetron essentially consists of the voltage U that is applied between the anode and cathode (filament) of the magnetron, see FIG. 1, said voltage generally being called the anode voltage. This anode voltage may be of the order of a few kilovolts. The current I passing through the magnetron as a result of said voltage is generally called the anode current.

In order for the magnetron to operate properly, the emission of electrons from the filament of the magnetron needs to be sufficiently large to provide a stable generation of microwaves. Generally, it is therefore necessary to provide a filament current $I_f$, at least during magnetron start-up, through the filament for heating thereof. The filament typically consists of a filament body having a surface coating which increases the capacity of the filament to emit electrons. The filament current is typically provided by a low voltage power source of about of a few volts.

When the magnetron emits output power, the filament is indirectly heated as a result of some electrons returning to the filament. If these electrons have sufficiently high energy, more free electrons will be generated by secondary emission. As a result, the filament current may often be removed once the magnetron is operating at full power.

Hence, it is suitable to adjust the filament current according to the current power level if the magnetron is to be operated at varying power.

Conventionally, such adjustment has been provided by experimentally determining which filament currents are suitable at different power levels and by storing such power-filament current-relations as a table or function in a filament current control unit (denoted FCC in FIG. 1). Using such a table or function, the filament current control unit adjusts the filament current based upon the current power level of the magnetron.

OBJECTS OF THE INVENTION

An object of the invention is to provide more optimal and stable magnetron operation.

Another object of the invention is to provide more optimal control of the filament current of a magnetron.

A further object of the invention is to increase the life of a magnetron.

Yet another object of the invention is to minimize the total power supplied to a magnetron at a certain output power.

SUMMARY OF THE INVENTION

The above mentioned objects is achieved by methods or devices according to the accompanying claims.

According to the invention, control of the filament current passing through a filament of a magnetron is accomplished by detecting, during operation, a parameter which is related to the actual emission capacity of the filament and by controlling the filament current of the magnetron depending on the detected emission capacity.

Hence, the invention is based upon the insight as to the advantage of controlling the filament current based upon information relating to characteristics of the magnetron reflecting the emission capacity of the filament, specifically whether or not the emission capacity of the filament is sufficient to provide a desired magnetron operation, and not only based upon the current power level.

The prior art adjustment, which is described above and which is based solely upon the current power level, does not consider changes occurring as the magnetron grows older, is heated, undergoes varying load, or the like. This means that a selected filament current, which for a certain power level were considered suitable when the magnetron was new, may prove less suitable when the magnetron has been used for a longer period of time. If, for example, the table stored in the filament current control unit, which provides the relations between power and filament current, is not updated in consideration of such aging effects, the working point of the magnetron will gradually be moved away from the desired one. Similar negative effects may occur when the magnetron load is varied or when the magnetron is gradually heated during start-up.

Consequently, for optimal operation, the magnetron may require a higher filament current at a desired power level after having been used for a period of time compared to when it was new. The prior art adjustment scheme is hence insufficient in this respect.

Furthermore, nor is a too high emission desired, while the emission capacity of the filament will then decrease prematurely, thus decreasing the life of the magnetron. The use of either a too high or a too low filament current will consequently result in a premature decreasing of the filament emission capacity at a specific temperature.

The lifetime and function of the magnetron is enhanced by the invention, as the control according to the invention adjusts the filament current in consideration of the magnetron characteristics also after having been used a period of time and at varying loads, etc.

Hence, the invention is based upon an understanding that the function of the magnetron is associated with the emission capacity of the filament. A basis for a proper operation of the magnetron is that the emission of electrons from the filament is not allowed to decrease under a defined working level. By ensuring that the actual or actual emission level does not fall below a threshold level, the magnetron will continue to operate in a desired manner.

If the emission is kept sufficiently large to provide a stable oscillation at high efficiency, a longer working lifetime of the magnetron will be obtained.

Hence, the control of the filament current according to the invention is preferably performed by relating the detected emission capacity to a desired emission capacity, preferably depending on the magnetron power level, and by then controlling the filament current depending on this relation.

According to one aspect of the invention, control of the filament current is achieved by detecting the actual or current dynamic impedance of the magnetron. The detection of the actual dynamic impedance is performed in association with a desired dynamic impedance at the current power level. Control of the filament current is then performed depending on this relation.

Referring to FIG. 2, the dynamic impedance of a magnetron is generally defined as the ratio between a change $\Delta U$ in the anode voltage of the magnetron and the corresponding change ΔI in the anode current of the magnetron which, at that specific point in time, is associated which said change in the anode voltage.

When the filament current, and hence the emission of electrons, is too low, an increase in the anode voltage will only result in a small change in the anode current, as the supply of current carriers is limited, and hence the magnetron will show a large dynamic impedance. When, on the other hand, the filament current, and hence the emission of electrons, is too high, an increase in the anode voltage will give rise to a larger change in the anode current, as the supply of current carriers now is good, and the magnetron will hence show a low dynamic impedance.

According to the inventors, the value of the dynamic impedance at the required filament current for required emission will not change essentially when the emission capacity or the required emission level changes as a result of the magnetron aging or being heated or as a result of load changes, etc. Hence, control or the filament current based upon the dynamic impedance represents an essential inventive step which provides a number of advantages compared to prior art.

As is clear from the discussion above, according to a preferred embodiment, the filament current is increased when said actual dynamic impedance is larger than said desired dynamic impedance and is decreased when said actual dynamic impedance is lower than said desired dynamic impedance. Of course, other kinds of transfer functions which is based upon the use of the dynamic impedance of the magnetron may be used in depending on the actual application.

According to a preferred embodiment of said first aspect of the invention, said detection of the actual dynamic impedance of the magnetron is accomplished by applying a small change, preferably in the form of a controlled ripple, on the anode current (or voltage) of the magnetron and by then measuring the change in the anode voltage (or current) of the magnetron caused thereby, said actual dynamic impedance being calculated based upon the magnitude of said applied ripple and said measured ripple.

The detection of the anode current may, for example, be accomplished by the use of an impedance, preferably a resistance, which is arranged in series with the power supply to the magnetron, said anode current, either directly or transformed via a high voltage transformer, giving rise to a voltage drop over the impedance, said voltage drop being used as a measure of the anode current. The anode voltage may also be measured either directly at the magnetron or before the high voltage transformer if this has a fixed transformation relation within the frequency range being of interest for the ripple measurement. Of course, a man skilled in the art will realize that there are may different ways to provide and detect such or similar ripples or variations.

Another preferable manner in which the anode current may be measured is by detecting the current using a current transformer having a primary coil being arranged in series with the magnetron, said anode current flowing through said primary coil.

According to another embodiment of the first aspect of the invention, said detecting of the actual dynamic impedance of the magnetron is provided by measuring a ripple remaining from the power supply network on the anode current or anode voltage of the magnetron, said dynamic impedance of the magnetron then being calculated based upon the measured ripple values.

According to a second aspect of the invention, control of the filament current is provided by detecting, during operation, a noise level of the magnetron, preferably a noise in the power supply to or the power output from the magnetron, and by controlling the filament current depending on said noise level. Said actual or actual noise level is preferably compared to a noise level desired for the current power level of the magnetron, the relation between said noise levels providing a bases for the control of the filament current.

In a similar way as for the dynamic impedance, the noise level of the magnetron may be used as a measure of the actual emission capacity of the filament. According to the inventors, the noise level at the required filament current for the required emission level will essentially not change when the required filament current changes, e.g. as the magnetron grows older.

In FIGS. 3*a* and 3*b*, two diagrams are illustrated showing the spectral content of the output signal from the magnetron at two different emission levels. The diagram in FIG. 3*a* shows the signal behavior when the filament current is well adapted to the required emission level, whereas the diagram in FIG. 3*b* shows the behavior when the emission is too high. As is clear, the noise level significantly increases as the emission from the filament becomes too high.

When the filament current, and consequently the emission of electrons, is too low, the noise level of the magnetron will be correspondingly low. When, on the other hand, the filament current, and consequently the emission of electrons, is too high, the noise level in the system will increase correspondingly. Hence, it is possible to define a desired level of noise corresponding to a required emission from the filament for a specific power level.

According to a preferred embodiment of the second aspect of the invention, the filament current is increased if the actual noise level is lower than the desired noise level and is decreased if the actual noise level is higher than the desired noise level.

Since magnetrons generally have a relatively low dynamic impedance, they are typically powered by a power supply which keeps the current essentially fixed. Therefore, in such cases, the power supply noise will primarily occur in the anode voltage. According to a preferred embodiment the noise is therefore detected in the anode voltage of the magnetron. Of course, it is understood that the anode current may be used just as well for the same purpose.

According to yet another embodiment of the second aspect of the invention, a microwave antenna is used to detect the microwave signal emitted by the magnetron, the noise level of the microwave signal then being used to represent the actual emission capacity.

Preferably, the noise level of the magnetron is considered within a significant range of its frequency spectrum, which may vary depending on the type of magnetron, the application and the working power level, but which according to a preferred embodiment ranges from about 100 kHz to about 100 MHz (from the carrier wave frequency if the detection is made in the output signal of the magnetron).

According to another aspect of the invention, the detection of the dynamic impedance or noise level of the magnetron may be used to determine a filament current level being associated with a power level for providing a desired behavior of the magnetron at said power level. Such determining may then be used for crating a more optimal table or function of the kind used in prior art.

As discussed above, the invention and the different aspects thereof is based upon the insight as to the advantages of, when choosing a parameter for controlling the filament current, selecting a feedback parameter having a generally unique or distinctive connection to the required emission level. Hence, control according to the invention may be said to be adaptive in the sense that the control function is based upon the detection of a variable which shows an inherent adaptation to changes in the characteristics or operating circumstances of the magnetron.

In accordance with the different aspects discussed above, the invention provides automatic compensation for external factors, such as changes in load or cooling, which affects the optimal working condition of the magnetron, and for the aging of the magnetron and changes of its characteristics associated therewith. The lifetime of the magnetron is increased as the filament temperature is never set higher than what is necessary for the provision of a required emission. The occurrence of so called filament thinning is suppressed. The proper adjustment of the filament current in relation to the current power level and the required emission increases stability, for example when lowering the magnetron power, during which oscillation variations and similar stabilization problems easily occur.

BRIEF DESCRIPTION OF THE DRAWINGS

Exemplifying embodiments of the invention will now be described with reference to the accompanying drawings, wherein:

FIG. 3*a* schematically shows a diagram illustrating the spectral content of the magnetron output signal at a desired emission state;

FIG. 3*b* schematically shows a diagram illustrating the spectral content of the magnetron output signal when the filament current is too high;

FIG. 4 schematically shows a first embodiment of the present invention;

DETAILED DESCRIPTION OF PREFERRED EMBODIMENTS

Figure 1:
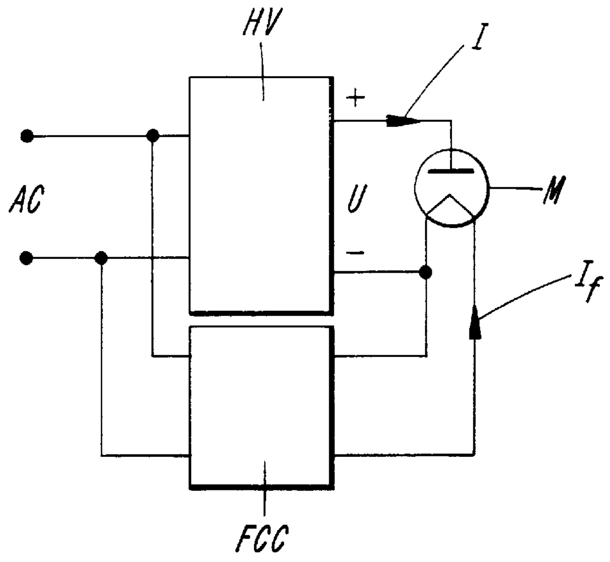
FIG. 1 PRIOR ART
FIG. 1 schematically shows a conventional magnetron power supply arrangement.

FIG. 1 schematically shows a prior art arrangement for supplying power to a magnetron M. The power is provided from an alternating voltage source AC, said alternating voltage being transformed and rectified by a high voltage generating block HV into a rectified high voltage which is applied over the anode and filament (cathode) of the magnetron and which forms an anode voltage U. This anode voltage is associated with an anode current I. Further, the power supply comprises a filament current control unit FCC which, based upon the current power level provides a filament current If through the filament of the magnetron M.

Figure 2:
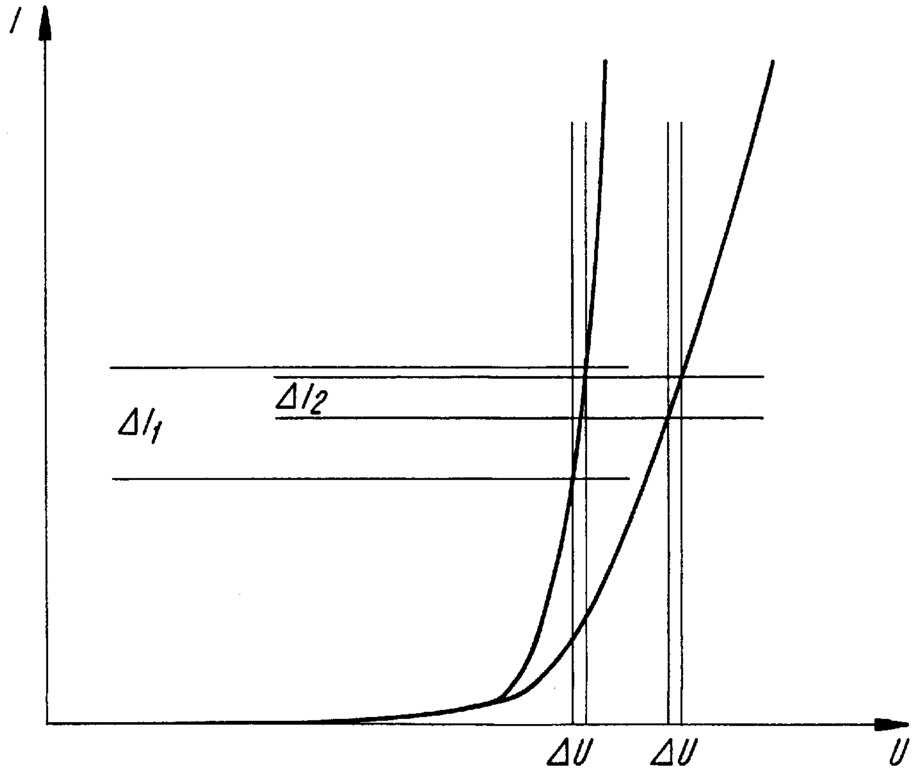
FIG. 2 schematically shows curves illustrating the anode current as a function of the anode voltage of a magnetron.

In FIG. 2, two curves are schematically shown illustrating relations between the anode current and the anode voltage of a magnetron. The difference between the curves illustrates a change in magnetron load, a change in magnetron temperature, an effect of magnetron aging, or the like. The figure illustrates the change in dynamic impedance that a changing of said factors may lead to. In FIG. 2, the dynamic impedance $\Delta U/I_1$ of the magnetron is at the working point shown on the first curve, whereas it has risen to $\Delta U/I_2$ at the working point shown on the second curve. As described above, and as will be described further below, this change in dynamic impedance is used according to the invention for providing control or the magnetron filament current.

In FIGS. 3*a* and 3*b*, curves are shown illustrating the spectral content of the magnetron output signal at a desired emission state and an undesired emission state, respectively, said undesired emission state in this case resulting from the filament current being too high. From the figures, it is clear that the noise level is much higher at a too high filament current compared to the noise level at the desired emission state. According to the invention, this change in noise level is used for controlling the filament current level, as described above. The output signal in FIGS. 3*a* and 3*b* is centered round a carrier wave frequency, which for example may be 2450 MHz. When detecting the noise level, preferably the part of the spectrum lying within about 100 MHz from this center frequency is considered.

A first embodiment of a device for controlling a filament current through a filament (cathode) of a magnetron M based upon a magnetron noise level will now be described with reference to FIG. 4.

The power supply unit PS in FIG. 4 comprises a high voltage generating block HV which transforms a network voltage AC into a high voltage, said high voltage being provided to the magnetron M and hence forming the anode voltage U of the magnetron. A power control unit PC provides a signal to the high voltage generating block HV, said signal designating the current desired power to be provided to the magnetron M. Further, the power supply unit PS comprises a filament current supply unit FCS which receives power from the network voltage AC and which provides a filament current If through the filament of the magnetron M, the magnitude of the filament current $I_f$ being controlled by a signal from a control unit 10.

The control unit 10 comprises a control circuit 12, a comparator 14, and a signal converter 16. The control circuit receives the power signal from the power control unit PC. Based upon the current power level, the control circuit 12 provides a signal indicating the desired or required noise level to the comparator 14. At the same time, the current anode voltage U is detected, whereby the actual noise level of the anode voltage is derived by the signal converter 16. The comparator 14 determines whether the actual noise level is above or below the desired noise level and provides said control signal to the filament current supply unit FCS, instructing it to increase or decrease the filament current. If the actual noise level is too high, the filament current is reduced, and if the actual noise level is too low, the filament current is increased, whereby the actual noise level is made equal to the desired or required noise level.

A second embodiment of a device for controlling the filament current through a filament of a magnetron M based upon a magnetron noise level will now be described with reference to FIG. 5.

Description of those components or parts in this and the following figures that correspond to elements which have already been described above with reference to FIG. 4 and which are denoted with corresponding numerals, will be omitted in the following for ease of description.

Figure 5:
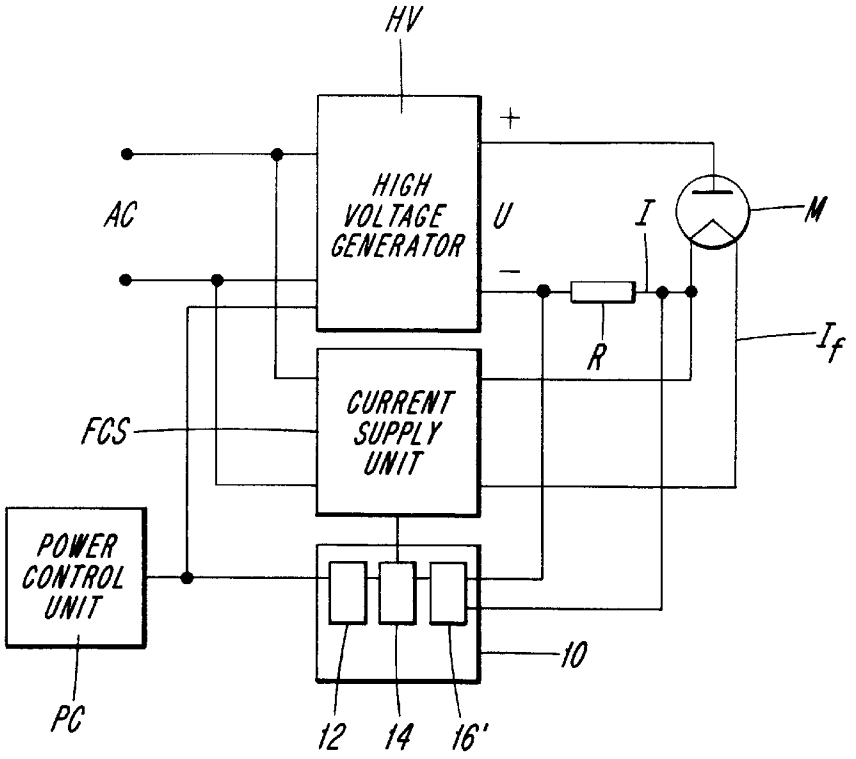
FIG. 5 schematically shows a second embodiment of the present invention.

In FIG. 5, a noise level of the anode current I and not the anode voltage U, as was the case in FIG. 4, is detected. In FIG. 5, the anode current I is detected as a voltage drop over a small resistance R which is provided in series with the magnetron M, said anode current $I_f$ passing through said resistance. The signal converter 16' detects the noise level of the voltage detected over the resistance R and converts this into a signal which indicates the actual noise level and which is compared by the comparator 14 to the desired or required noise level which is provided by the control circuit 12 based upon the current power level. Control of the filament current supply unit FCS, and consequently of the filament current $I_f$, is then accomplished based upon the result of this comparison in a similar manner as described with reference to FIG. 4.

A third embodiment of a device for controlling a magnetron filament current based upon a magnetron noise level will now be described with reference to FIG. 6.

Figure 6:
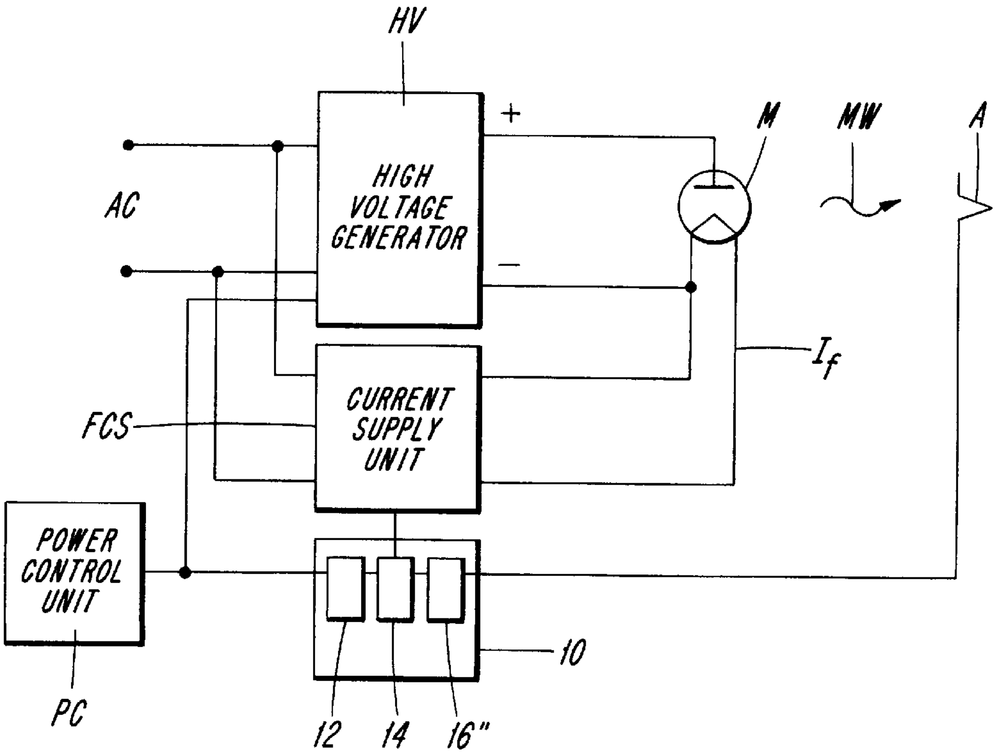
FIG. 6 schematically shows a third embodiment of the present invention.

In FIG. 6, a noise level of the microwave output signal MW from the magnetron M is detected using a microwave antenna A. The signal converter 16" receives the signal collected by the antenna and determines the level of noise within a preferred specific frequency range round the carrier wave frequency of the microwave. Hence, the signal converter 16" converts the signal from the antenna A into a signal which indicates the actual noise level and which is compared by the comparator 14 with the desired or required noise level provided by the control circuit 12 based upon the current power level. Control of the filament current supply unit FCS, and consequently of the filament current $I_f$, is then accomplished based upon the result of this comparison in a similar manner as described with reference to FIG. 4 and 5.

As is understood, the signal converters 16, 16', and 16" in FIGS. 4, 5, and 6, respectively, comprise such filtering and processing means which are needed for the deriving of the requested noise level information from the noise signals received by the signal converters.

A fourth embodiment of a device for controlling a magnetron filament current based upon the detection of the dynamic impedance of the magnetron, will now be described with reference to FIG. 7.

Figure 7:
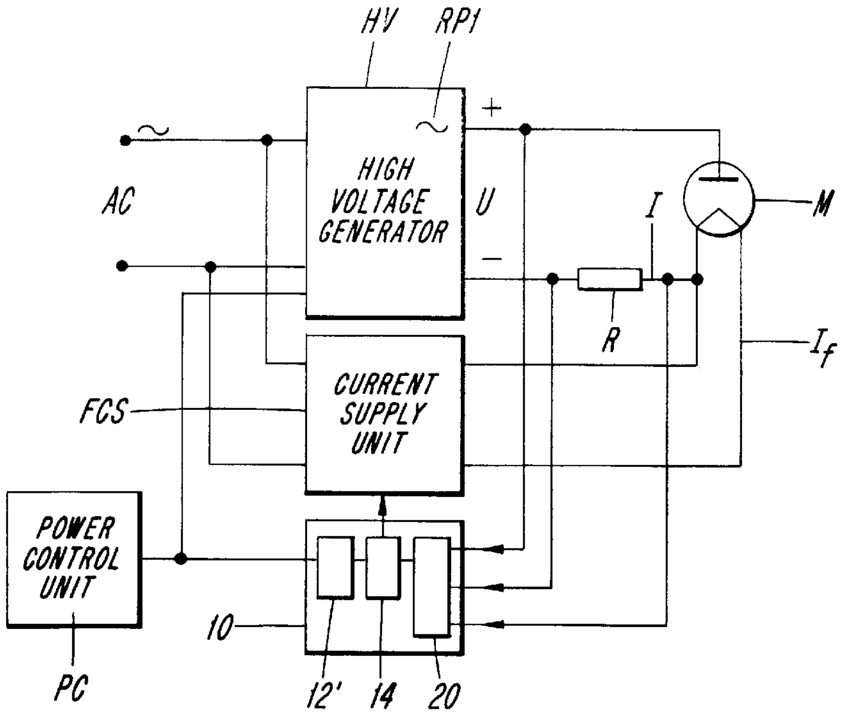
FIG. 7 schematically shows a fourth embodiment of the present invention.

In FIG. 7, the high voltage generating block HV is arranged to transform the voltage AC in such a way that oscillations or ripples RP1 remaining from the network voltage AC is present in the anode voltage or current. The magnitude of these ripples is detected and converted by the signal converter into a value representing the actual dynamic impedance of the magnetron. The signal converter thus calculates the ratio between the ripple of the anode voltage and the ripple of the anode current.

In this embodiment, the control circuit 12' is arranged to, depending on the present power level provided by the power control unit PC, provide a signal, which corresponds to a desired or required dynamic impedance, to the comparator 14. The comparator 14 compares this required impedance with the value of the actual dynamic impedance provided by the signal converter 20. The comparator 14 controls the filament current supply unit FCS according to the result of this comparison. If the actual dynamic impedance is higher than the desired one, the filament current supply unit FCS is instructed to increase the filament current, and if the actual dynamic impedance is lower than the desired one, the unit FCS is instructed to reduce the filament current, as discussed above. The anode current I is detected as the voltage drop occurring over a small resistance R, in a similar way as described with reference to FIG. 5.

A fifth embodiment of a device for controlling the filament current based upon the dynamic impedance of the magnetron will now be described with reference to FIG. 8.

Figure 8:
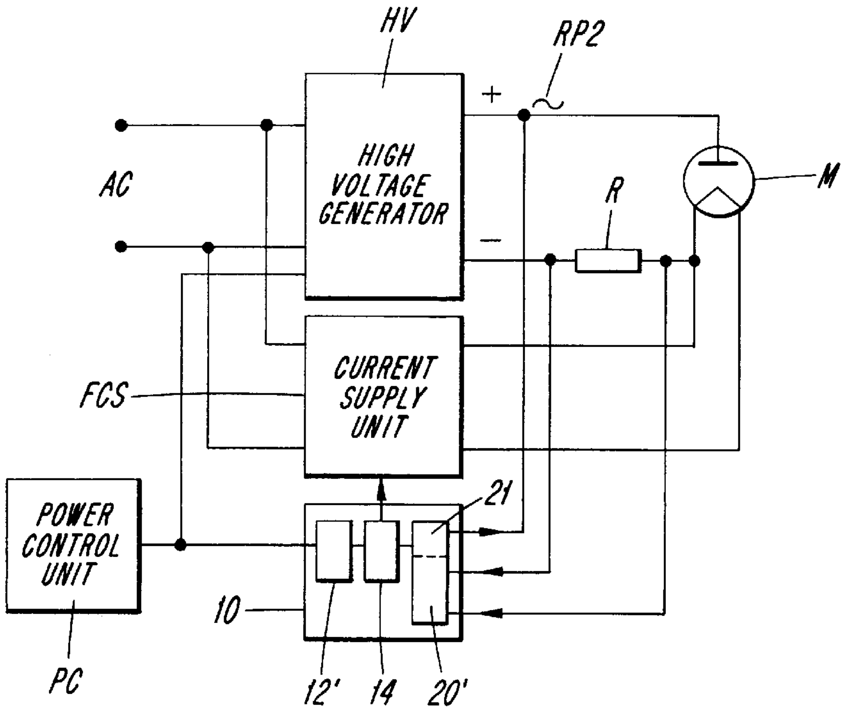
FIG. 8 schematically shows a fifth embodiment of the present invention.

In FIG. 8, an oscillation circuit 21 provided in the control unit 10 generates an oscillation or ripple RP2 in the anode voltage provided by the high voltage generating block HV. This ripple will give rise to a corresponding ripple in the anode current, said anode current ripple being detected in a similar manner as described with reference to FIG. 7. The signal converter 20' calculates a value representing the actual dynamic impedance of the magnetron based upon the magnitude of the generated anode voltage ripple and the detected anode current ripple.

Hence, in this embodiment, there essentially does not exists any remaining ripple from the network voltage, in contrast to the embodiment described with reference to FIG. 7.

The desired or required dynamic impedance at the current power level, as provided by the control circuit 12' in FIG. 8, is compared by the comparator 14 to the actual dynamic impedance provided by the signal converter 20'. The comparator 14 controls the filament current supply unit FCS based thereupon in a similar manner as described with reference to FIG. 7.

As is understood, the arrows shown at the inputs/outputs of the signal converter/oscillator 20', 21 in FIGS. 7 and 8 are not intended to define directions of the flow of currents, but only whether information is received or transmitted at the respective input/output.

Even though the invention has been described using exemplifying embodiments thereof, it is understood by those skilled in the art that many different modifications, variations, and combinations of the embodiments described above may be performed within the scope of the invention, as defined by the accompanying claims. For example, the invention may be realized as on single filament current control circuit which comprises the function of several of the components or parts described in the embodiments above. Further, the emission capacity, dynamic impedance and magnetron noise level may be detected or measured in many different ways than the ones

What is claimed is:

1. Method for controlling a magnetron filament current, comprising the steps of:

detecting the actual dynamic impedance of the magnetron during operation; and controlling the magnetron filament current based thereupon.

2. Method as claimed in claim 1, comprising:

relating said actual dynamic impedance of the magnetron to a desired dynamic impedance for the current magnetron power level; and controlling the magnetron filament current based upon said relation.

3. Method as claimed in claim 2, wherein said detection of the actual dynamic impedance of the magnetron comprises the steps of:

providing a periodical variation (RP2) in the anode voltage or anode current of the magnetron;

measuring the variation in the anode current or anode voltage, respectively, caused thereby; and calculating the actual dynamic impedance based upon the magnitudes of said provided and measured variations.

4. Method as claimed in claim 2, wherein said detection of the actual dynamic impedance of the magnetron comprises the steps of:

measuring a variation (RP1) in the anode current and anode voltage, respectively, remaining from the power supply network; and calculating said actual dynamic impedance based upon the magnitudes of said measured variations.

5. Method as claimed in claim 2, said controlling step comprising:

increasing the filament current when said actual dynamic impedance is larger than said desired dynamic impedance; and decreasing the filament current when said actual dynamic impedance is lower than said desired dynamic impedance.

6. Method as claimed in claim 5, wherein said detection of the actual dynamic impedance of the magnetron comprises the steps of:

providing a periodical variation (RP2) in the anode voltage or anode current of the magnetron;

measuring the variation in the anode current or anode voltage, respectively, caused thereby; and calculating the actual dynamic impedance based upon the magnitudes of said provided and measured variations.

7. Method as claimed in claim 5, wherein said detection of the actual dynamic impedance of the magnetron comprises the steps of:

measuring a variation (RP1) in the anode current and anode voltage, respectively, remaining from the power supply network; and calculating said actual dynamic impedance based upon the magnitudes of said measured variations.

8. Method as claimed in claim 1, wherein said detection of the actual dynamic impedance of the magnetron comprises the steps of:

providing a periodical variation (RP2) in the anode voltage or anode current of the magnetron;

measuring the variation in the anode current or anode voltage, respectively, caused thereby; and calculating the actual dynamic impedance based upon the magnitudes of said provided and measured variations.

9. Method as claimed in claim 8, wherein said anode current is detected as a voltage drop over an impedance, a resistance, provided in series with the magnetron, wherein said anode current flows through said impedance.

10. Method as claimed in claim 8, wherein said anode current is detected as an output signal from a current transformer, said transformer having a primary coil provided in series with the magnetron and said anode current flowing through said primary coil.

11. Method as claimed in claim 1, wherein said detection of the actual dynamic impedance of the magnetron comprises the steps of:

measuring a variation (RP1) in the anode current and anode voltage, respectively, remaining from the power supply network; and calculating said actual dynamic impedance based upon the magnitudes of said measured variations.

12. Method as claimed in claim 11, wherein said anode current is detected as a voltage drop over an impedance, a resistance, provided in series with the magnetron, wherein said anode current flows through said impedance.

13. Method as claimed in claim 11, wherein said anode current is detected as an output signal from a current transformer, said transformer having a primary coil provided in series with the magnetron and said anode current flowing through said primary coil.

14. Method for controlling a magnetron filament current, comprising the steps of:

detecting an actual noise level of the magnetron, specifically a noise in the output signal from the power supply to said magnetron, during operation; and controlling the magnetron filament current based thereupon;

whereupon said detection of the actual noise level comprises detecting the noise in the microwave signal outputted by the magnetron.

15. Device for controlling a magnetron filament current, comprising:

detection means for detecting an actual noise level of the magnetron, specifically in the output signal from the power supply to said magnetron; and control means for controlling the magnetron filament current based upon said detected actual noise level;

wherein said detection means comprise a microwave antenna (A) for detecting noise in the microwave signal (MW) outputted by the magnetron.

16. Device for controlling a magnetron filament current, comprising:

detection means (20, R; 20', 21, R) for detecting an actual dynamic impedance of a magnetron; and control means (10) for controlling the magnetron filament current based upon said detected actual dynamic impedance.

17. Device as claimed in claim 16, comprising means (12') for providing a desired dynamic impedance setting for the magnetron power level to said control means, said control means comprising comparator means (14) for comparing the actual dynamic impedance with the desired dynamic impedance.

18. Device as claimed in claim 17, wherein said control means (10) comprise oscillator means (21) for generating an oscillation (RP2) in the anode voltage or anode current of the magnetron, said detection means (20', R) being arranged to detect the oscillation in the anode current or anode voltage, respectively, caused thereby.

19. Device as claimed in claim 9, wherein said detection means (20, R) are arranged to detect said actual dynamic impedance by detecting oscillations (RPI), remaining from a power supply network, in the anode voltage and anode current of the magnetron.

20. Device as claimed in claim 17, wherein said control means (10) is arranged to increase the filament current when the actual dynamic impedance is larger than the desired dynamic impedance and to decrease the filament current when the actual dynamic impedance is lower than the desired dynamic impedance.

21. Device as claimed in claim 20, wherein said control means (10) comprise oscillator means (21) for generating an oscillation (RP2) in the anode voltage or anode current of the magnetron, said detection means (20', R) being arranged to detect the oscillation in the anode current or anode voltage, respectively, caused thereby.

22. Device as claimed in claim 20, wherein said detection means (20, R) are arranged to detect said actual dynamic impedance by detecting oscillations (RP1), remaining from a power supply network, in the anode voltage and anode current of the magnetron.

23. Device as claimed in claim 16, wherein said control means (10) comprise oscillator means (21) for generating an oscillation (RP2) in the anode voltage or anode current of the magnetron, said detection means (20', R) being arranged to detect the oscillation in the anode current or anode voltage, respectively, caused thereby.

24. Device as claimed in claim 23, wherein said detection means comprise an impedance (R), a resistance, said impedance being connected in series with the magnetron and said anode current being arranged to flow through said impedance, wherein said detection means further comprise means for detecting the voltage drop over said impedance as a measure of said anode current.

25. Device as claimed in claim 23, wherein said control means comprise processing means (20, 20') being arranged to receive values relating to the magnitude of said generated and detected oscillations and to calculate, based thereupon, a value representing the actual dynamic impedance, and to provide this calculated value to said comparator means.

26. Device as claimed in claim 25, wherein said detection means comprise an impedance (R), a resistance, said impedance being connected in series with the magnetron and said anode current being arranged to flow through said impedance, wherein said detection means further comprise means for detecting the voltage drop over said impedance as a measure of said anode current.

27. Device as claimed in claim 16, wherein said detection means (20, R) are arranged to detect said actual dynamic impedance by detecting oscillations (RP1), remaining from a power supply network, in the anode voltage and anode current of the magnetron.

28. Device as claimed in claim 27, wherein said control means comprise processing means (20, 20') being arranged to receive values relating to the magnitude of said generated and detected oscillations and to calculate, based thereupon, a value representing the actual dynamic impedance, and to provide this calculated value to said comparator means.

29. Device as claimed in claim 27, wherein said detection means comprise an impedance (R), a resistance, said impedance being connected in series with the magnetron and said anode current being arranged to flow through said impedance, wherein said detection means further comprise means for detecting the voltage drop over said impedance as a measure of said anode current.

* * * * *